United States Patent
Yang et al.

(10) Patent No.: US 12,244,101 B2
(45) Date of Patent: Mar. 4, 2025

(54) SHIELDING CAGE STRUCTURE WITH RESPECT TO THE RECEPTACLE CONNECTOR WITHIN

(71) Applicant: Molex, LLC, Lisle, IL (US)

(72) Inventors: Che-Yuan Yang, New Taipei (TW); You-Qian Lu, New Taipei (TW); Chun-Hsiang Chiang, New Taipei (TW)

(73) Assignee: Molex, LLC, Lisle, IL (US)

(*) Notice: Subject to any disclaimer, the term of this patent is extended or adjusted under 35 U.S.C. 154(b) by 334 days.

(21) Appl. No.: 17/726,540

(22) Filed: Apr. 22, 2022

(65) Prior Publication Data
US 2022/0344874 A1  Oct. 27, 2022

(30) Foreign Application Priority Data

Apr. 23, 2021 (CN) .......................... 202110442880.8

(51) Int. Cl.
*H01R 13/6581* (2011.01)
(52) U.S. Cl.
CPC ................................. *H01R 13/6581* (2013.01)
(58) Field of Classification Search
CPC .............. H01R 13/6581; G02B 6/4277; H05K 9/0058; H05K 9/0073
See application file for complete search history.

(56) References Cited

U.S. PATENT DOCUMENTS

| 7,357,673 B2 * | 4/2008 | Long .................... H05K 9/0058 439/607.05 |
| 7,789,704 B2 | 9/2010 | Ho |
| 9,711,901 B2 * | 7/2017 | Scholeno ............. G02B 6/4284 |

FOREIGN PATENT DOCUMENTS

| CN | 202749615 U | 2/2013 |
| CN | 102938522 B | 12/2016 |
| CN | 107819237 A | 3/2018 |
| TW | M304815 U | 1/2007 |
| TW | I728765 B | 5/2021 |
| WO | 2007084764 A1 | 7/2007 |
| WO | 2016041527 A1 | 3/2016 |

* cited by examiner

*Primary Examiner* — Vanessa Girardi

(57) ABSTRACT

A connector assembly is disclosed to include a shielding cage and a receptacle connector. The shielding cage forms at least one insertion space and a front end port communicatively coupled to the insertion space, the insertion space is defined by a top wall, a bottom wall and two side walls which cooperate with each other. The receptacle connector is provided to a rear segment of the shielding cage and includes a receptacle housing. The shielding cage further includes at least one stopping piece and at least one support stopping block which extend into the insertion space, the support stopping block is interposed between the stopping piece and the receptacle housing and supports the stopping piece. In another manner, the shielding cage may include a withdrawing stop portion and a rear stopping piece, the withdrawing stop portion is used to limit the receptacle housing to displace rearwardly, the rear stopping piece is used to stop the receptacle housing from behind the receptacle housing.

14 Claims, 13 Drawing Sheets

SHIELDING CAGE STRUCTURE WITH RESPECT TO THE RECEPTACLE CONNECTOR WITHIN

RELATED APPLICATIONS

This application claims priority to Chinese Patent Application No. 202110442880.8 filed on Apr. 23, 2021, which is incorporated herein by reference in its entirety.

TECHNICAL FIELD

The present disclosure relates to a connector assembly, particularly relates to a connector assembly used in high-speed data applications.

BACKGROUND

In existing connector assemblies which each include a shielding cage, a receptacle connector and a pluggable module, the receptacle connector is provided in the shielding cage and may allow the pluggable module to insert therein and connect therewith, however, when the pluggable module is upside down and inserted into the shielding cage, and an upside down insertion structure design is lacked, the pluggable module may collide with the receptacle connector to damage the receptacle connector.

In some cases, connector assemblies may provide guiding structures to cooperate with each other between the shielding cage and the pluggable module (for example, a guiding groove and a guiding piece which cooperate with each other), so when the pluggable module is inserted into the shielding cage in a proper orientation, the guiding structures may play the guiding function. However, when the pluggable module is inserted upside down into the shielding cage, the guiding structures may not be able to cooperate with each other and generate structure interference. In turn, the pluggable module cannot mate with the receptacle connector, thereby preventing upside down insertion.

In addition, when a force to insert the pluggable module is too large, it may also make the receptacle connector subject to a large rearward pushing force and generate improper rearward displacement, which affects structure stability of the receptacle connector provided in the shielding cage.

SUMMARY

Therefore, an object of the present disclosure is to provide a connector assembly which may prevent a pluggable module from colliding with a receptacle connector when the pluggable module is inserted upside down into the connector assembly.

Another object of the present disclosure is to provide connector assembly which may strengthen the receptacle connector to resist a rearward force.

Accordingly, in some cases, a connector assembly of the present disclosure may comprise a shielding cage and a receptacle connector. The shielding cage forms at least one insertion space and a front end port communicatively coupled to the insertion space, the insertion space is defined by a top wall, a bottom wall and two side walls. The receptacle connector is provided to a rear segment of the shielding cage and comprises a receptacle housing. The shielding cage further comprises at least one stopping piece and at least one support stopping block which extends into the insertion space, the support stopping block is interposed between the stopping piece and the receptacle housing and supports the stopping piece.

In one of embodiments, the stopping piece has a rear end surface, the receptacle housing has a front end surface, the support stopping block is interposed between the rear end surface of the stopping piece and the front end surface of the receptacle housing.

In one embodiments, at least one of the two side walls of the shielding cage is integrally provided with the stopping piece, the stopping piece bends from the side wall, extend into the insertion space and is positioned in front of the front end surface of the receptacle housing, the support stopping block is integrally constructed from the bottom wall of the shielding cage.

In one of embodiments, the stopping piece is positioned in front of one of corners of the front end surface of the receptacle housing.

In one of embodiments, the side wall is provided with a cut hole which surrounds and defines a protruding tab, the protruding tab perpendicularly bends toward an inside of the insertion space relative to the side wall to form the stopping piece.

In one of embodiments, a bending location of the stopping piece where the protruding tab bends is provided with a strengthening rib.

In one of embodiments, the bottom wall is provided with two grooved holes which are spaced apart from each other, a part of the bottom wall between the two grooved holes bulges toward the insertion space to form the support stopping block.

In one of embodiments, the shielding cage comprises an upper cage body and a bottom plate which are engaged with each other and a partitioning frame which is provided between the upper cage body and the bottom plate, the partitioning frame is provided in the shielding cage to partition the two insertion spaces in an up-down direction, and the partitioning frame comprises an upper wall and a lower wall, the bottom wall of one of the two insertion spaces is defined by the upper wall of the partitioning frame, the bottom wall of the other of the two insertion spaces is defined by the bottom plate.

In one of embodiments, the connector assembly further comprises a pluggable module which can insert into the insertion space, when the pluggable module is inserted upside down into the insertion space, the pluggable module is stopped by the stopping piece and cannot be inserted into the receptacle connector.

A connector assembly of the present disclosure comprises a shielding cage and a receptacle connector. The shielding cage forms at least one insertion space and a front end port communicatively coupled to the insertion space, the insertion space is defined by a top wall, a bottom wall and two side walls. The receptacle connector is provided to a rear segment of the shielding cage and comprises a receptacle housing. The shielding cage further comprises at least one stopping piece, the stopping piece integrally bends, extends into the insertion space and is positioned in front of a front end surface of the receptacle housing.

A connector assembly of the present disclosure comprises a shielding cage and a receptacle connector. The shielding cage forms at least one insertion space and a front end port communicatively coupled to the insertion space, the insertion space is defined by a top wall, a bottom wall and two side walls. The receptacle connector is provided to a rear segment of the shielding cage and comprises a receptacle housing. The shielding cage further comprises at least one support stopping block, the support stopping block is positioned in the insertion space, is used to stop the receptacle housing of the receptacle connector in a direction that the receptacle housing of the receptacle connector displaces forwardly.

A connector assembly of the present disclosure comprises a shielding cage and a receptacle connector. The shielding cage comprises an insertion space, a front end port communicatively coupled to the insertion space and a top wall and two side walls to define the insertion space. The receptacle connector is assembled into the shielding cage from behind the shielding cage, and comprises a receptacle housing and a recessed groove provided to the receptacle housing. The shielding cage further comprises a withdrawing stop portion and a rear stopping piece, the withdrawing stop portion is used to extend into the recessed groove and limit the receptacle housing to displace rearwardly, the rear stopping piece is formed to a rear end edge of the shielding cage and stops the receptacle housing from behind the receptacle housing.

In one of embodiments, each side wall of the shielding cage is provided with the withdrawing stop portion and the rear stopping piece, the rear stopping piece is formed by bending inwardly from a rear end edge of the side wall and extending, and the receptacle housing has a rear end surface and recessed portions which are formed to the rear end surface and respectively allow the rear stopping pieces of the two side walls to insert therein.

In one of embodiments, each withdrawing stop portion is formed by that a cut hole provided to the side wall surrounds and defines a protruding tab which a tip thereof is toward the front and the protruding tab bends inwardly and obliquely.

In one of embodiments, the receptacle connector further comprises a strip positioning block provided to the receptacle housing, and a rear end edge of the shielding cage further formed with a positioning hole which is recessed therefrom, when the receptacle connector is assembled to the shielding cage, the strip positioning block extends into the positioning hole.

In one of embodiments, the receptacle connector further comprises a T-shaped positioning block which is provided to the receptacle housing and whose longitudinal section is T-shaped, and the rear end edge of the shielding cage further is formed with a positioning aperture which is recessed therefrom, when the receptacle connector is assembled to the shielding cage, the T-shaped positioning block extends into the positioning aperture.

In one of embodiments, the shielding cage further comprises a bottom wall and two front stopping blocks which are formed to the bottom wall, are spaced apart from each other in a left-right direction, and extend into the insertion space, and the receptacle housing has two forward stopping faces which are respectively positioned at a left side and a right side of a bottom portion of the receptacle housing, when the receptacle connector is assembled to the shielding cage, the two front stopping blocks respectively stop the two forward stopping faces of the receptacle housing.

In some embodiments, the left side and the right side of the bottom portion of the receptacle housing are recessed to form two recessed notches, the two forward stopping faces respectively are inner wall surfaces of the two recessed notches which face forwardly.

An effect of the present disclosure lies in that, by use of the stopping piece, it reduces the chance the pluggable module will be inserted upside down into the receptacle connector. The support stopping block may strengthen the structure stability and the strength of the stopping piece subjected to collision, the support stopping block also may play the stopping function when the receptacle connector is assembled to the shielding cage. Moreover, by the withdrawing stop portion and the rear stopping piece, a strength of the receptacle connector resisting to a rearward force may be strengthened.

BRIEF DESCRIPTION OF THE DRAWINGS

Other features and effects of the present disclosure will be apparent from an embodiment illustrated in the drawings, in which.

DETAILED DESCRIPTION OF THE PREFERRED EMBODIMENT

Figure 1:
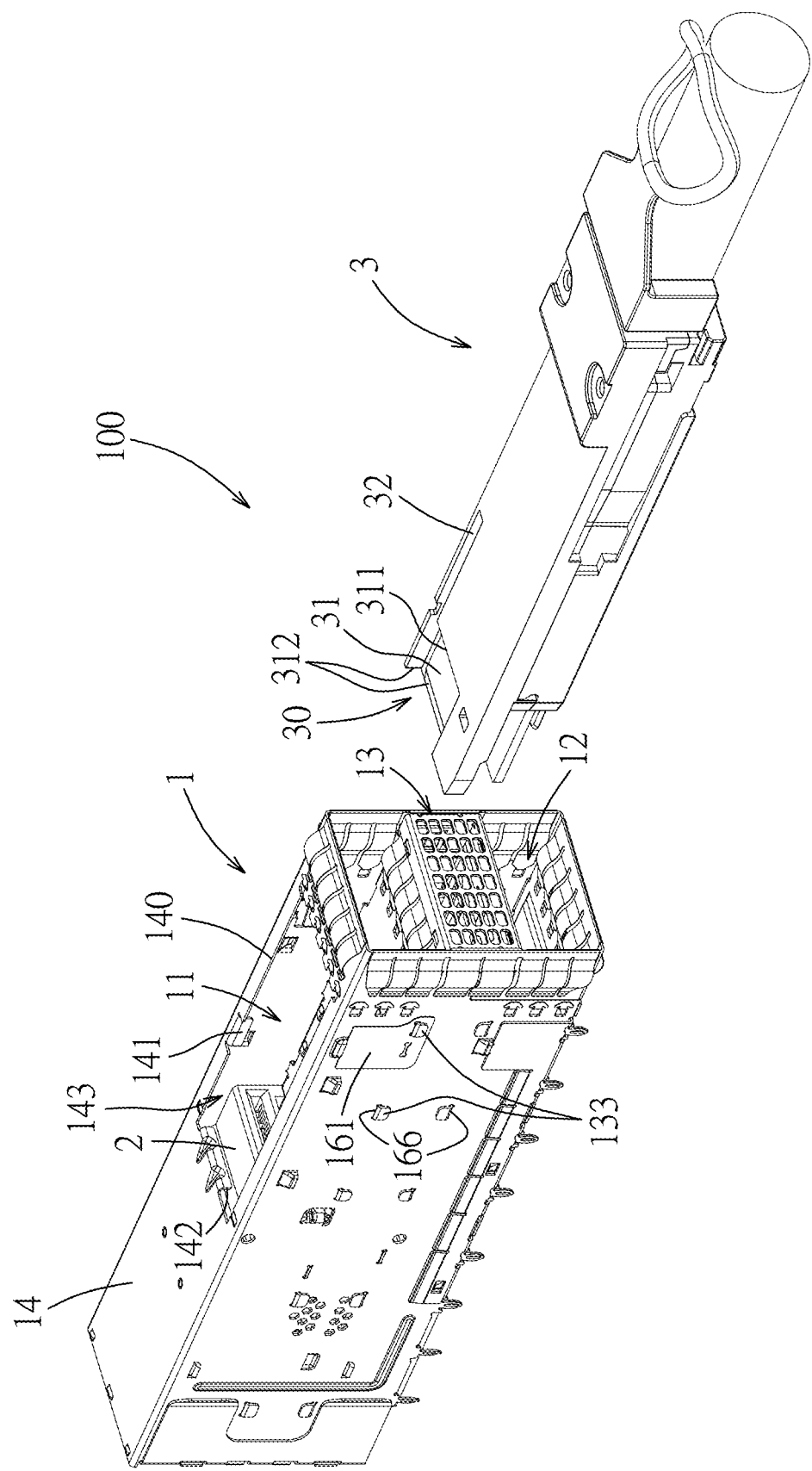
FIG. 1 is a perspective view of a first embodiment of a connector assembly of the present disclosure illustrating that the connector assembly includes a shielding cage, a receptacle connector and a pluggable module.
Figure 2:
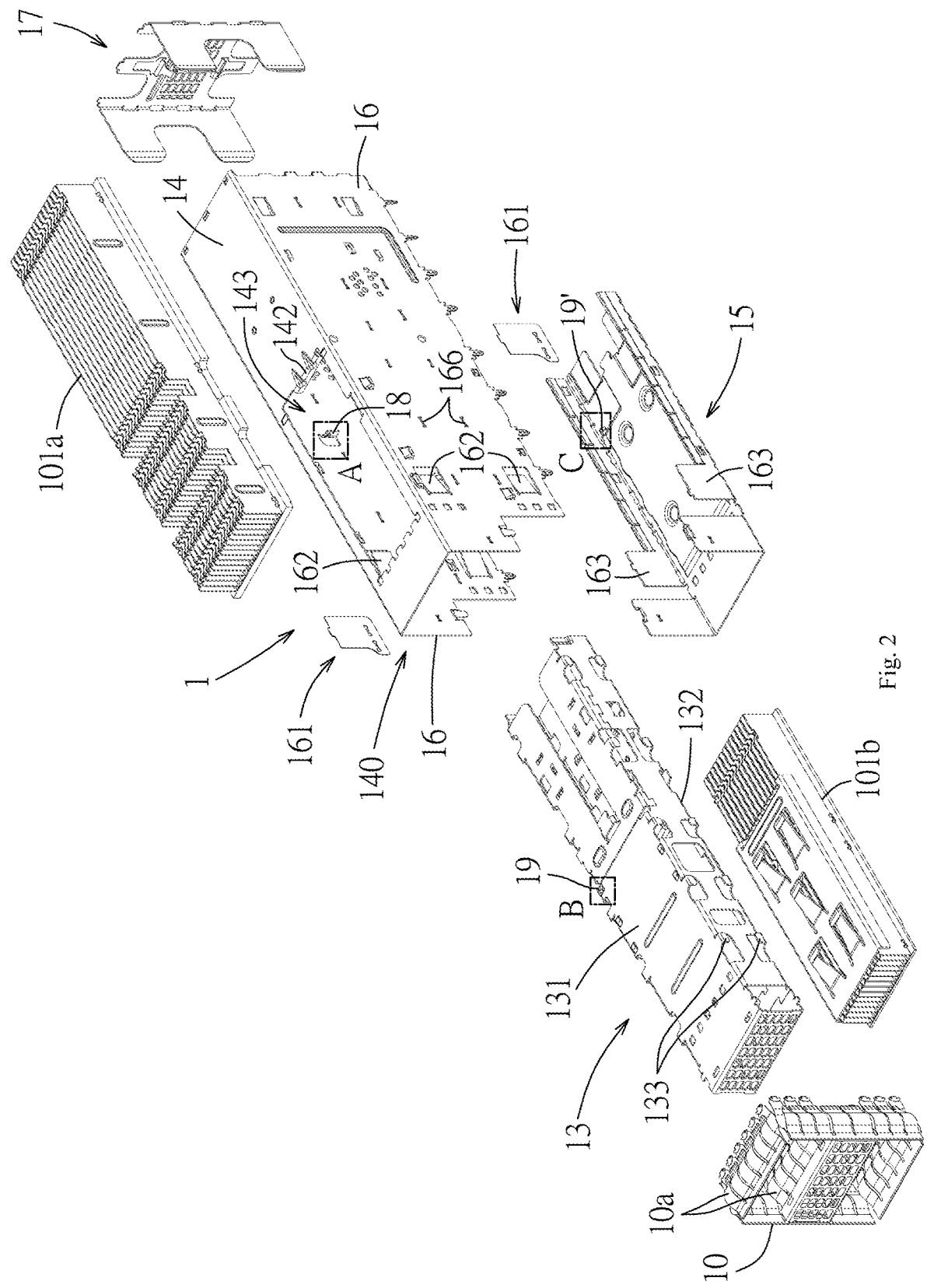
FIG. 2 is a perspective exploded view of a shielding cage of the first embodiment.
Figure 3:
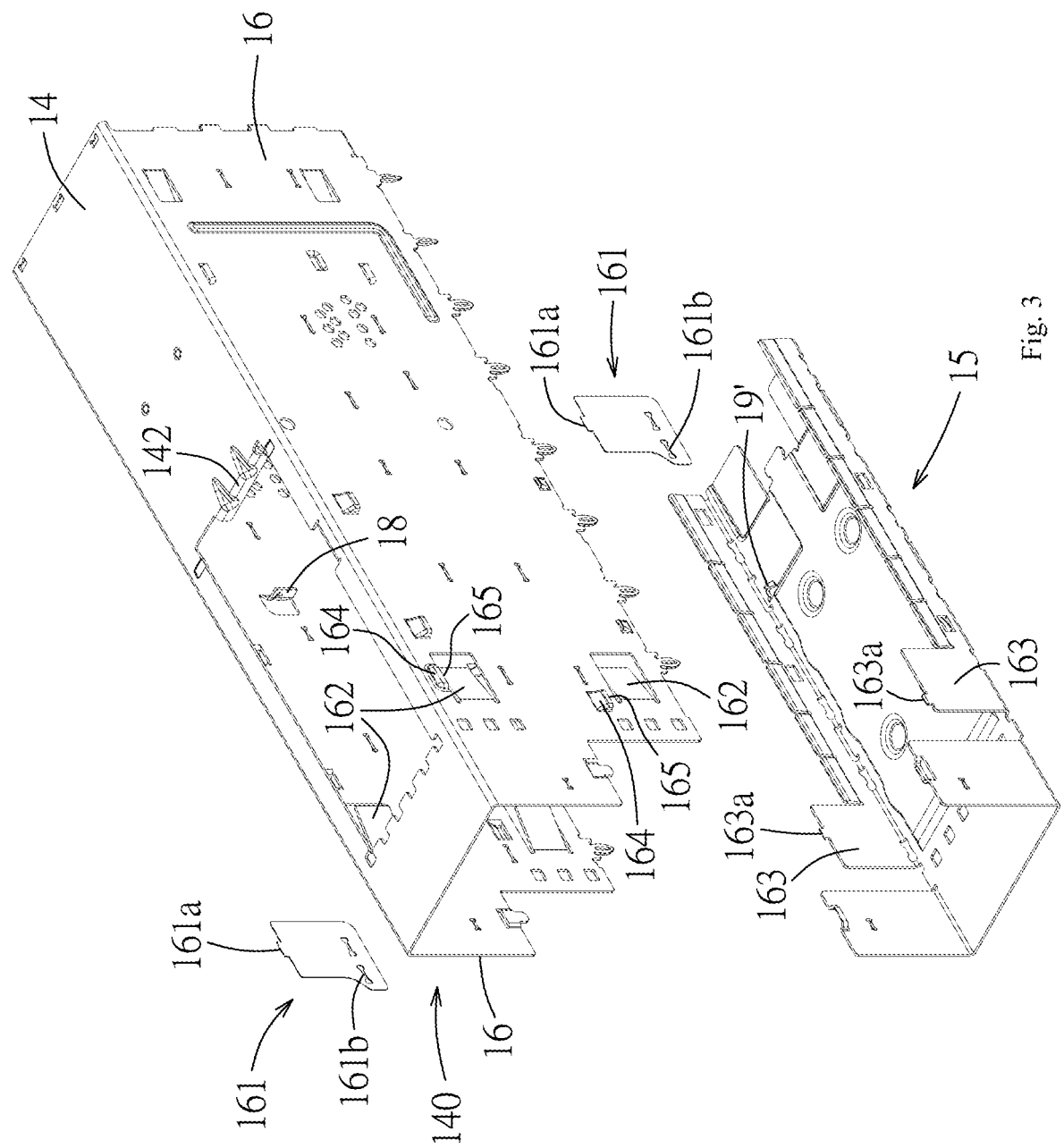
FIG. 3 is a perspective exploded view of an upper cage body, a bottom plate and two pairs of covering pieces of the shielding cage of the first embodiment.
Figure 4:
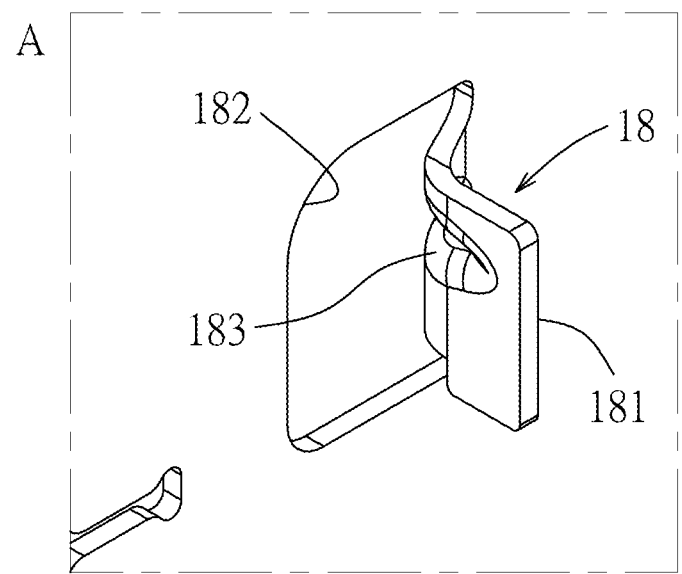
FIG. 4 is a partially enlarged view of a part of FIG. 2 indicated by A illustrating a stopping piece.
Figure 5:
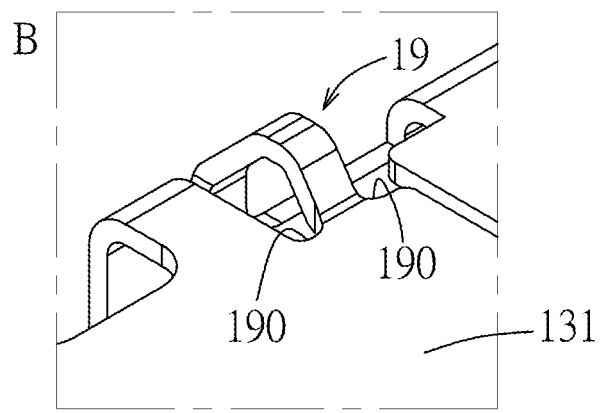
FIG. 5 is a partially enlarged view of a part of FIG. 2 indicated by B illustrating a support stopping block.
Figure 6:
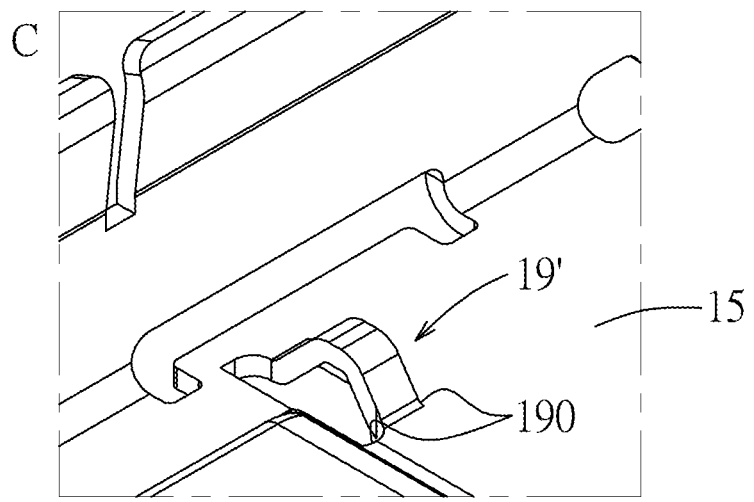
FIG. 6 is a partially enlarged view of a part of FIG. 2 indicated by C illustrating another support stopping block.
Figure 7:
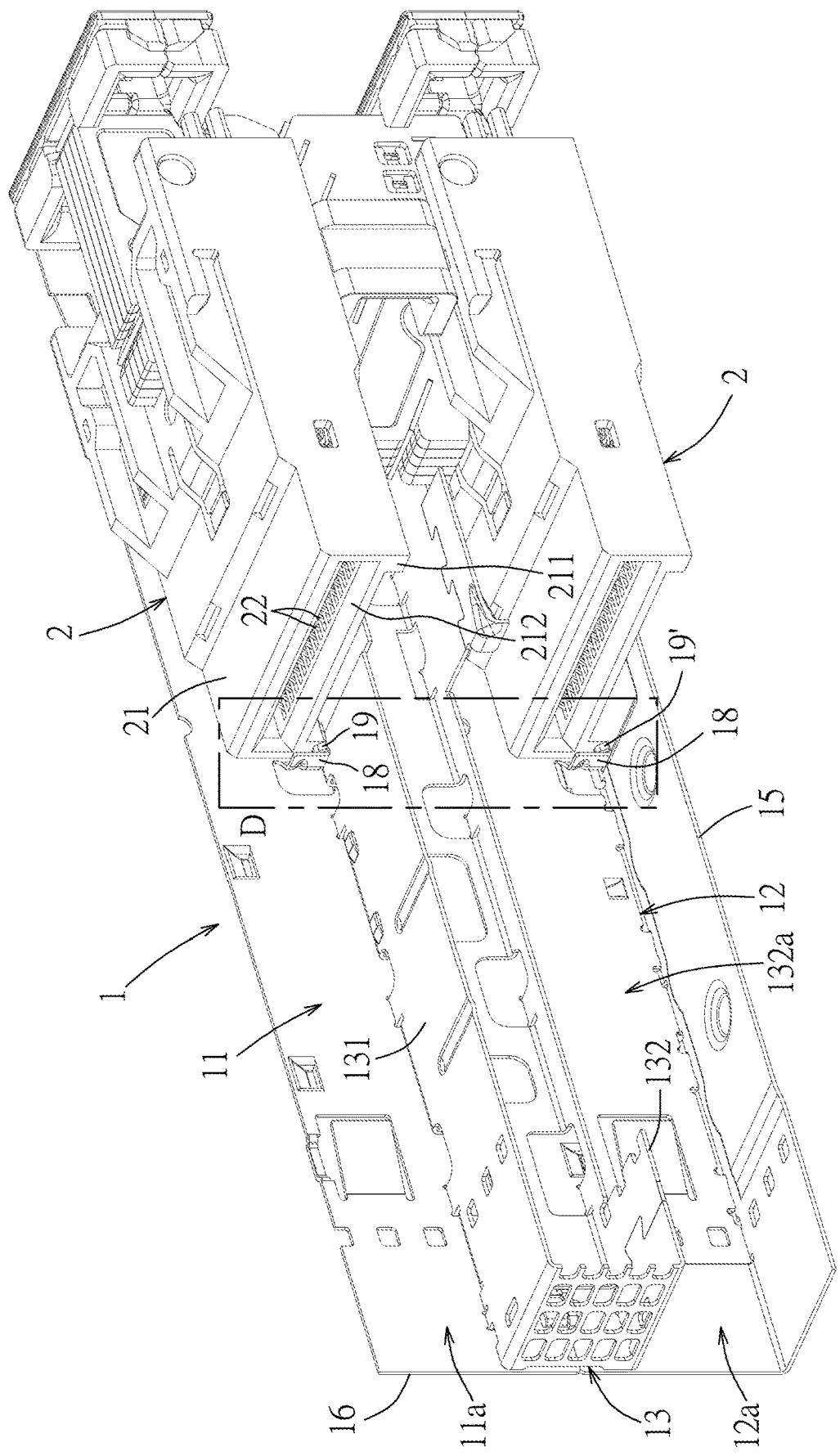
FIG. 7 is a partial perspective view of the first embodiment which illustrates a state that the receptacle connector is provided in the shielding cage and in which the shielding cage and a partitioning frame are partially cut away.

Before the present disclosure is described in detail, it is noted that like elements are represented by the same reference numerals in the following description.

Referring to FIG. 1 to FIG. 3 and FIG. 7, in a first embodiment of the present disclosure, a connector assembly 100 includes a shielding cage 1, two receptacle connectors 2, a pluggable module 3 and two heat sinks 101a, 101b, the two receptacle connectors 2 are provided in the shielding cage 1, the pluggable module 3 may be inserted into the shielding cage 1 and be inserted into the corresponding receptacle connector 2. In the present embodiment, the pluggable module 3 has an insertion end portion 30, a recessed groove 31 and a guiding channel 32, the recessed groove 31 extends in a direction from the front to the rear along a front edge of a top surface of the pluggable module 3 and forms an end surface 311 used to face the shielding cage 1, the guiding channel 32 further extends rearwardly from the end surface 311 of the recessed groove 31 to constitute an elongated channel.

The shielding cage 1 is formed with two insertion spaces 11, 12 and two front end ports 11a, 12a which are respectively communicatively coupled to the two insertion spaces 11, 12, each insertion space 11, 12 is defined by a top wall, a bottom wall and two side walls, in addition, the shielding cage 1 further includes a stopping piece 18, which in some embodiments is designed and positioned to reduce over-insertion, and a support stopping block 19, 19' positioned in each insertion space 11, 12.

In the present embodiment, the shielding cage 1 is constructed by a metal plate and is formed by, for example, die stamping and bending a metal thin plate. The shielding cage 1 has a substantial box-shaped structure in outer contour and includes an upper cage body 140, a bottom plate 15, a rear plate 17, a partitioning frame 13 and a grounding member 10 which are engaged with each other. The upper cage body 140 includes a top plate 14 and two side plates 16 which are integrally connected with each other, the top plate 14 has a window 143, and an inner edge of the window 143 positioned at a rear side of the window 143 is formed with a stopping piece 142 which integrally downwardly extends into the insertion space 11, a side edge of the window 143 close to one of the two side plates 16 also is formed with a guiding piece 141 which integrally downwardly extends into the insertion space 11, the guiding piece 141 is close to the one of the two side plates 16 and extends in a front-rear direction, the stopping piece 142 is positioned behind the guiding piece 141 and extends in a left-right direction. The partitioning frame 13 is provided between the two side plates 16 and is interposed between the upper cage body 140 and the bottom plate 15, so as to partition the two insertion spaces 11, 12 which are respectively positioned above and below the partitioning frame 13 and the two front end ports 11a, 12a which are respectively communicatively coupled to the two insertion spaces 11, 12. The partitioning frame 13 has a substantial hollow structure and includes an upper wall 131, a lower wall 132 and a plurality of latching pieces 133 which are formed to two sides of the partitioning frame 13, by that the plurality of latching pieces 133 at the two side of the partitioning frame 13 are respectively latch with a plurality of latching holes 166 provided to the two side plates 16 of the shielding cage 1, the partitioning frame 13 is fixed between the two side plates 16 and partitions the two insertion spaces 11, 12. The heat sink 101a of the two heat sinks 101a, 101b is provided on the top plate 14 of the upper cage body 140 and a bottom portion of the heat sink 101a extends into the insertion space 11 via the window 143, so as to provide heat dissipation for the pluggable module 3 inserted into the insertion space 11. The heat sink 101b of the two heat sinks 101a, 101b is provided in the partitioning frame 13 and a bottom portion of the heat sink 101b extends into the insertion space 12 via a lower wall window 132a formed in the lower wall 132, so as to provide heat dissipation for the pluggable module 3 inserted into the insertion space 12. The grounding member 10 is provided at the two front end ports 11a, 12a and has elastic fingers 10a which extend rearwardly and are distributed to an outer side and an inner side of each of the front end ports 11a, 12a, the elastic finger 10a positioned at the outer side of the front end port 11a, 12a is used to contact an edge of a mounting hole of a casing, the elastic finger 10a positioned at the inner side of the front end port 11a, 12a is used to contact the pluggable module 3.

In the present embodiment, each side plate 16 of the upper cage body 140 further has locking pieces 162 which each are formed from an opening and positioned in the opening and which each correspond to the respective insertion space 11, 12 and each are close to the respective front end port 11a, 12a, a structure of the locking piece 162 is formed by that a partial region of the side plate 16 is stamped to form a protruding piece and make the protruding piece bend inwardly obliquely, a function of the locking pieces 162 of the two side plates 16 is that when the pluggable module 3 is inserted into the insertion space 11, 12, the corresponding locking pieces 162 may respectively lock with a left side and a right side of the pluggable module 3.

The shielding cage 1 further includes two pairs of covering pieces 161, 163, the two pairs of covering pieces 161, 163 are respectively used to be fixed on the two side plates 16 and each cover the corresponding opening forming the corresponding locking piece 162, in the present embodiment, the two covering pieces 161 are independent pieces and are used to cover the openings forming the locking pieces 162 positioned at two sides of the insertion space 11, the two covering pieces 163 and the bottom plate 15 are an integrally connected construction and the two covering pieces 163 upwardly bends and extends relative to bottom plate 15 and are used to cover the openings forming the locking pieces 162 positioned at two side of the insertion space 12. A top edge of each covering piece 161, 163 protrudes to form a protruding tab 161a, 163a, and a bottom portion of each of the two covering pieces 161 is provided with a latching hole 161b. The covering piece 161 is positioned by that the protruding tab 161a thereof extends into an aperture 165, which is toward the down, of a bulging structure 164 which is formed in the corresponding side plate 16 and is positioned above the corresponding opening forming the corresponding locking piece 162, and the corresponding latching piece 133 of the partitioning frame 13 passes through the corresponding latching hole 166 of the side plate 16 and latches with the latching hole 161b of the covering piece 161, so that the covering piece 161 is fixed to an exterior of the side plate 16 and covers the corresponding opening forming the corresponding locking piece 162, and similarly, the two covering pieces 162 each are positioned by that the protruding tab 163a extend into a corresponding aperture 165, which is toward the down, of a corresponding bulging structure 164 which is formed in the side plate 16 and positioned above the corresponding opening forming the corresponding locking piece 162, so as to cover the corresponding opening forming the locking corresponding piece 162.

The two receptacle connectors 2 are respectively provided in the two insertion spaces 11, 12 of the shielding cage 1 and are close to the rear plate 17, that is, are positioned in a rear segment of the shielding cage 1, each receptacle connector 2 includes a receptacle housing 21 and a terminal 22 provided in the receptacle housing 21, the receptacle housing 21 has a front end surface 211 and an insertion slot 212 formed in the front end surface 211 to allow the pluggable module 3 to insert therein. The two receptacle connectors 2 may be separately constructed, or may be integrally constructed.

Referring to FIG. 2, FIG. 3, FIG. 7 and FIG. 8, as for the insertion space 11 positioned above the partitioning frame 3, the top wall of the insertion space 11 is defined by the top plate 14 of the upper cage body 140, the bottom wall of the insertion space 11 is defined by the upper wall 131 of the partitioning frame 13, the two side walls of the insertion space 11 are respectively defined by regions of the two side plates 16 positioned above the partitioning frame 13. As for the insertion space 12 positioned below the partitioning frame 3, the top wall of the insertion space 12 is defined by the lower wall 132 of the partitioning frame 3, the bottom wall of the insertion space 12 is defined by the bottom plate 15 of the shielding cage 1, the two side walls of the insertion space 12 are respectively defined by regions of the two side plates 16 positioned below the partitioning frame 3. The stopping piece 18 in each insertion space 11, 12 bends integrally from one of the two side walls of the insertion space 11 12, extends into the insertion space 11, 12, is spaced apart from the front end surface 211 of the receptacle housing 21 and is positioned in front of the front end surface 211 of the receptacle housing 21. Each stopping piece 18 has a rear end surface 181 facing the receptacle housing 21, in practice, formation of the stopping piece 18 is: the side wall is provided with a cut hole 182 surrounding and defining a protruding tab, and the protruding tab perpendicularly bends relative to the side wall toward the inside of the insertion space 11, 12 by, for example, stamping to form the stopping piece 18, and the stopping piece 18 is positioned in front of one corner of the front end surface 211 of the receptacle connector 2, for example, in the present embodiment, the stopping piece 18 is positioned to face a lower left corner of the front end surface 211 of the receptacle connector 2. In addition, in order to strengthen the structure strength, at a bending location of the stopping piece 18, further by, for example, a stamping manner, the bending location of the stopping piece 18 is partially deformed to form a strengthening rib 183. Referring to FIG. 2, FIG. 5 to FIG. 6 and FIG. 8, the support stopping blocks 19, 19' each are positioned in front of the same corner of the receptacle connector 2 where the corresponding stopping piece 18 is positioned, the support stopping block 19 positioned in the insertion space 11 above the partitioning frame 3 is formed to the upper wall 131 of the partitioning frame 13 and is interposed between the rear end surface 181 of the stopping piece 18 and the front end surface 211 of the receptacle housing 21, so that the support stopping block 19 may be used to support the corresponding stopping piece 18, the support stopping block 19' positioned in the insertion space 12 below the partitioning frame 3 is formed to the bottom plate 15 and is interposed between of the rear end surface 181 of the corresponding stopping piece 18 and the front end surface 211 of the receptacle housing 21, so that the support stopping block 19' may be used to support the corresponding stopping piece 18. A specific structure of each support stopping block 19, 19' is that, the upper wall 131 of the partitioning frame 13 (or the bottom plate 15) is provided with two grooved holes 190 which are spaced apart from each other, and a part of the upper wall 131 (or the bottom plate 15) between the two grooved holes 190 bulges toward the corresponding insertion space 11, 12 by, for example, stamping manner to have a reverse V-shape or a reverse U-shape to form the support stopping block 19, 19'.

Figure 8:
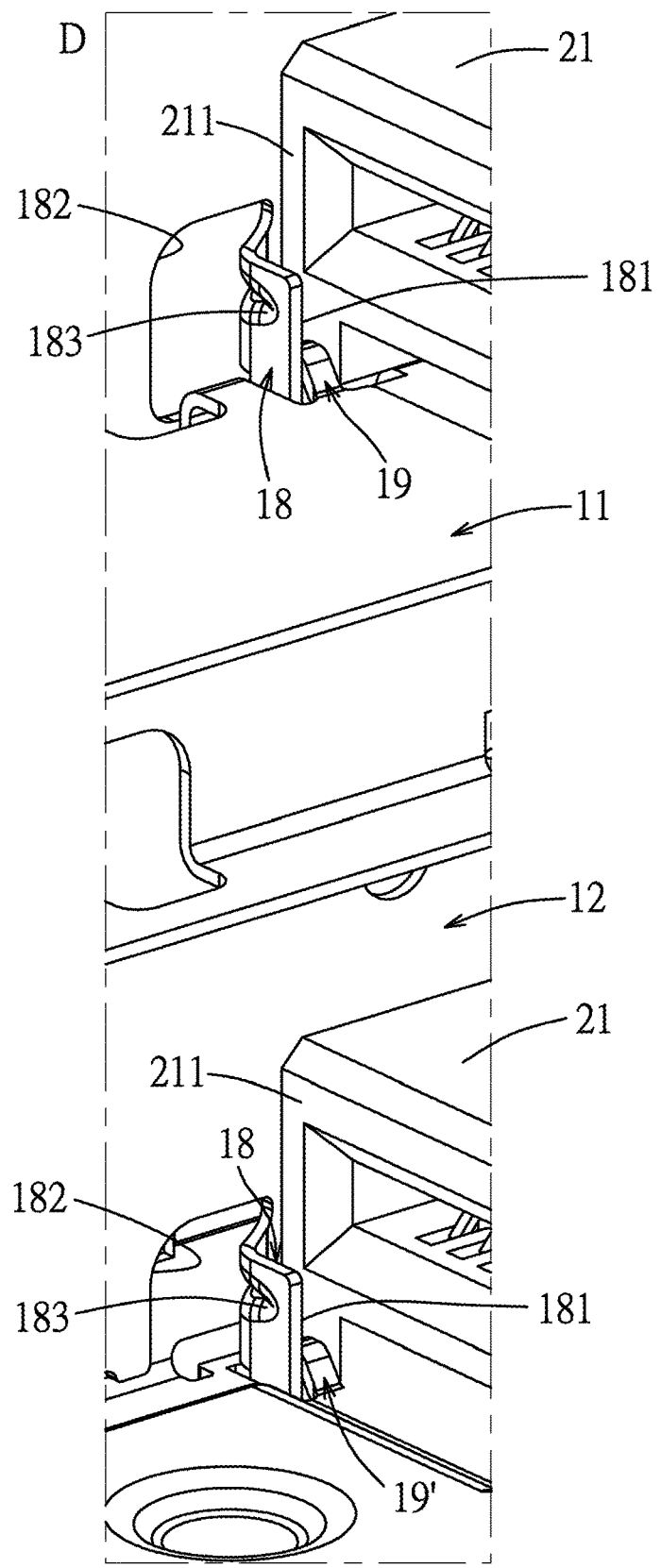
FIG. 8 is a partially enlarged view of a part of FIG. 7 indicated by D.

Referring to FIG. 1 and FIG. 8, when the pluggable module 3 is inserted into the insertion space 11 (or insertion space 12) under a proper orientation, by that the guiding piece 141 slides into the guiding channel 32 of the pluggable module 3 to play the guiding function and determine whether the pluggable module 3 is inserted into the insertion space 11 (or insertion space 12) under the proper orientation, when the pluggable module 3 is inserted into the receptacle connector 2, the stopping piece 142 of the shielding cage 1 also stops the end surface 311 of the recessed groove 31 of the pluggable module 3, which avoids a force being further rearwardly applied to the pluggable module 3 to push the receptacle connector 2, and prevents the pluggable module 3 from over-insertion. Moreover, the stopping piece 18 and the support stopping block 19, 19' similarly also may play the stopping function, avoids the pluggable module 3 further over-inserting into the receptacle connector 2. But another function of the support stopping block 19, 19' lies in that, when the receptacle connector 2 is assembled into the shielding cage 1 from the rear of the shielding cage 1 toward the front of the shielding cage 1, the support stopping block 19, 19' may stop the receptacle housing 21 in a direction that the receptacle connector 2 displaces forwardly.

Figure 9:
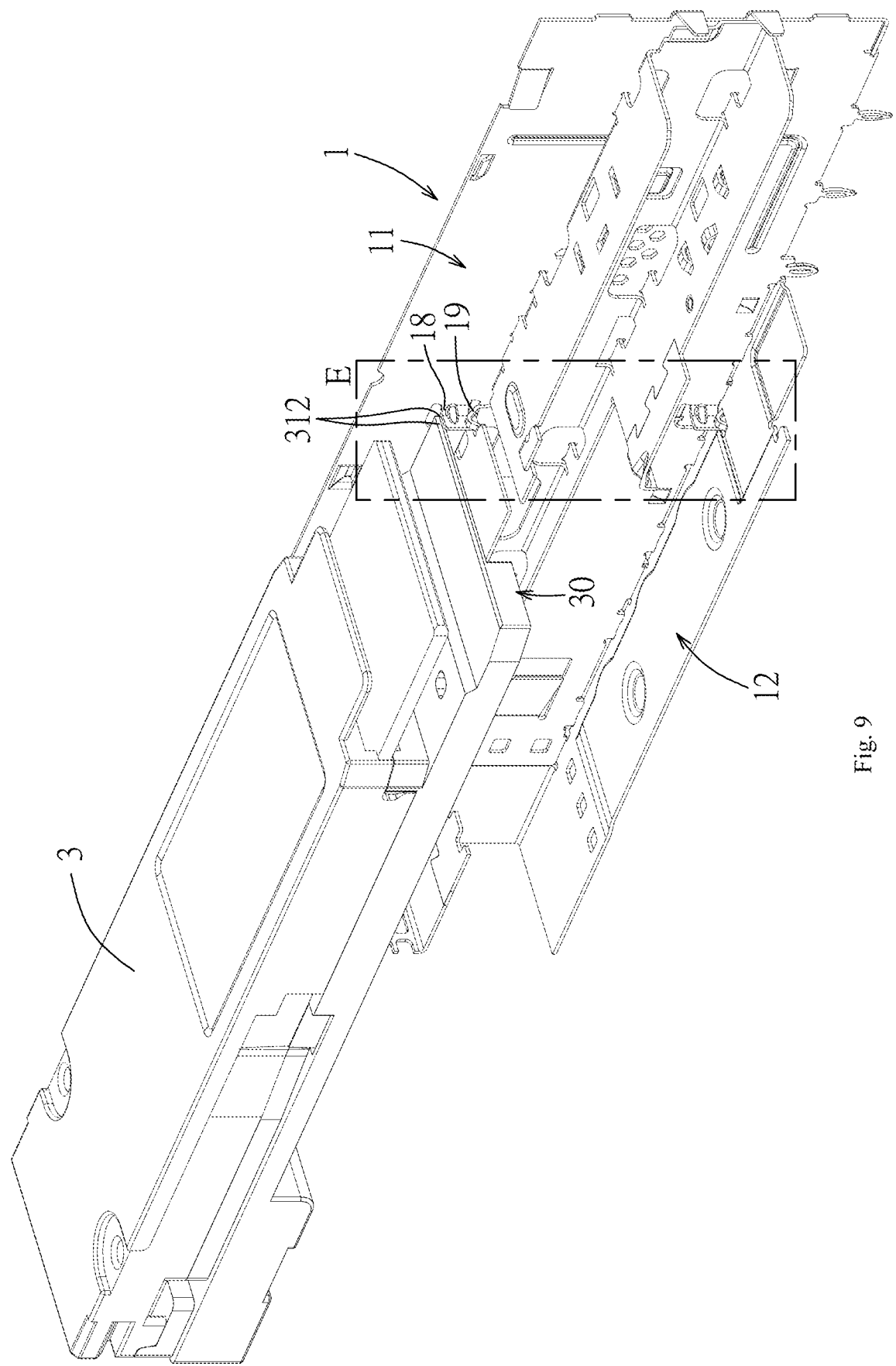
FIG. 9 is a partial perspective view of the first embodiment which illustrates a state that the pluggable module is inserted upside down into the shielding cage and in which the shielding cage and the partitioning frame are partially cut away.
Figure 10:
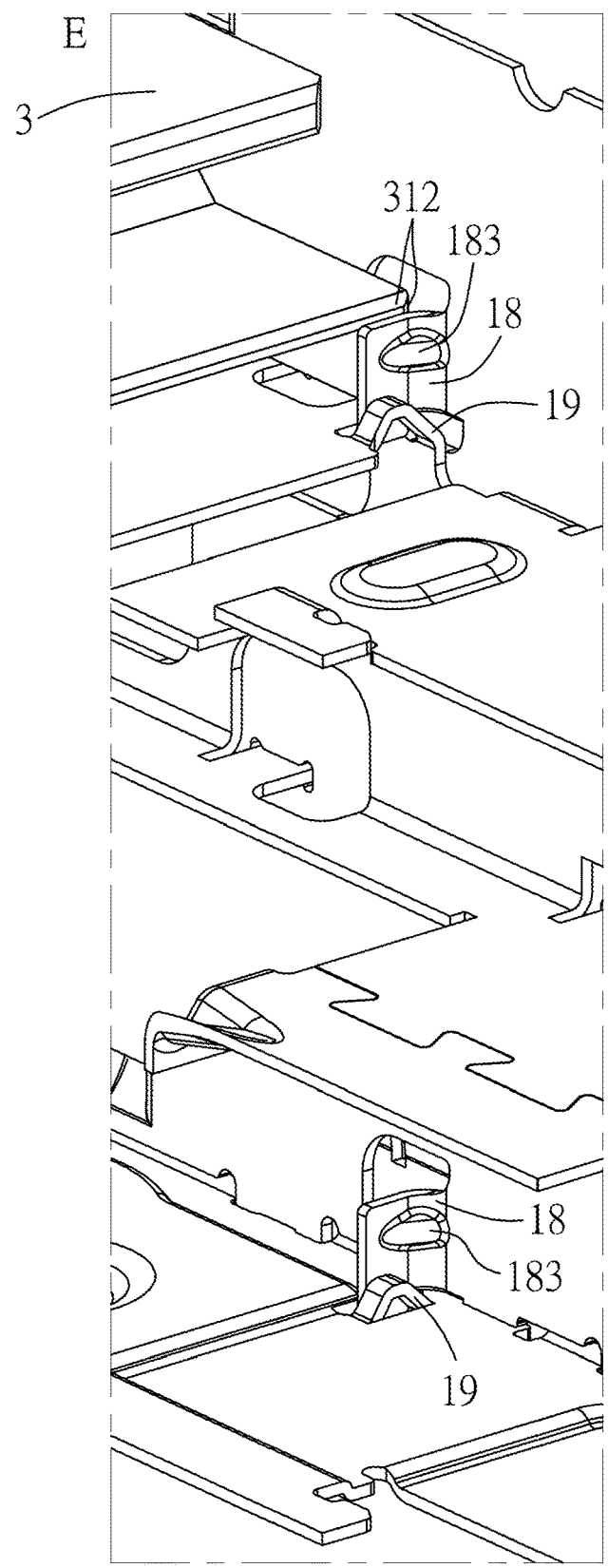
FIG. 10 is a partially enlarged view of a part of FIG. 9 indicated by E.
Figure 11:
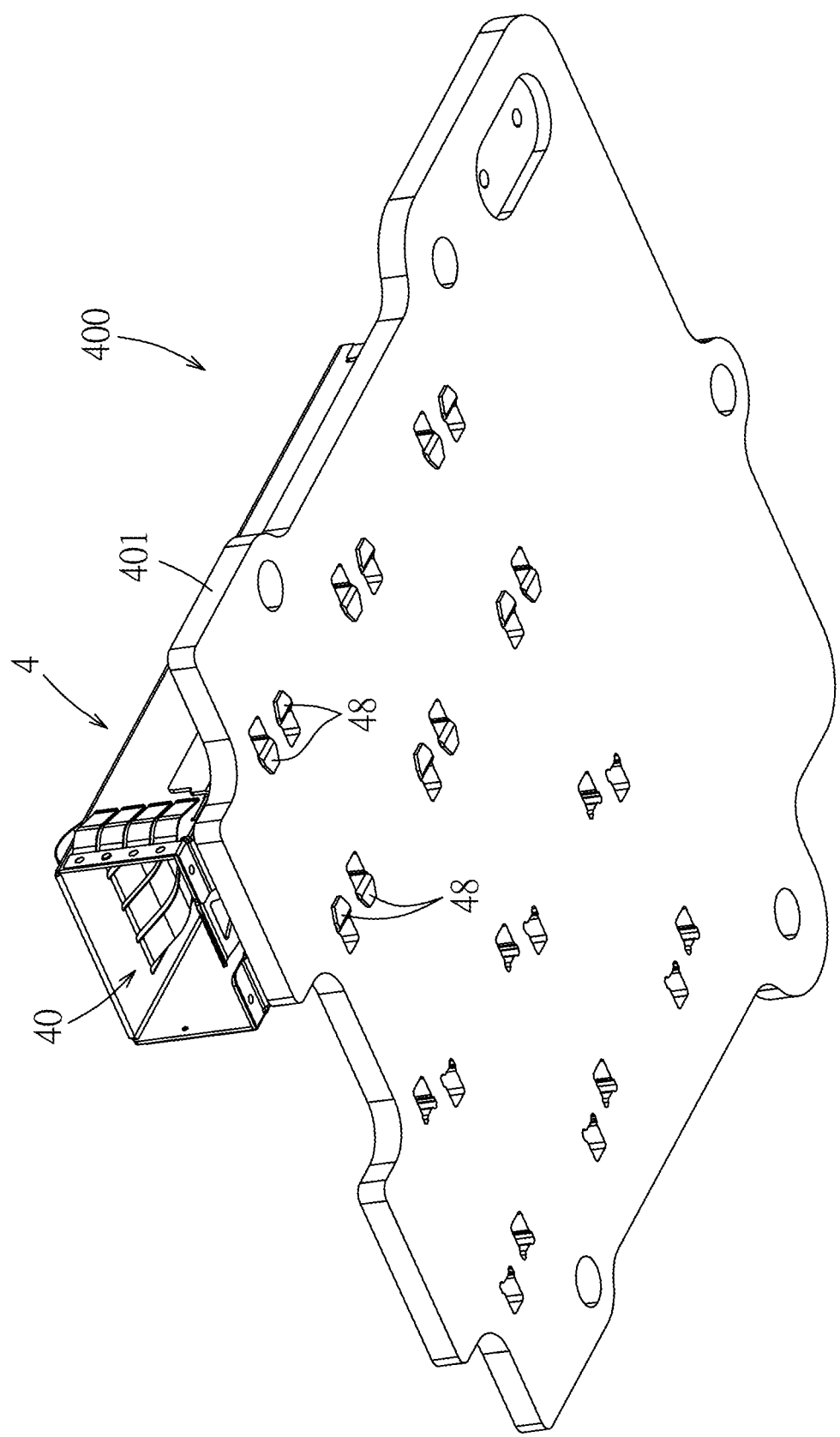
FIG. 11 is a perspective view of a second embodiment of a connector assembly of the present disclosure illustrating that the shielding cage is provided on a carrying board.

Referring to FIG. 9 and FIG. 10, when the pluggable module 3 is inserted upside down into the insertion space 11 above the partitioning frame 3 or the insertion space 12 below the partitioning frame 3, before the pluggable module 3 is inserted into the receptacle connector 2, a corner of the front end edge 312 of the insertion end portion 30 of the pluggable module 3 will correspond to the position of the stopping piece 18 and is stopped by the stopping piece 18 so that the pluggable module 3 cannot further displace rearwardly to insert into the receptacle connector 2, which in turn may avoid the pluggable module 3 damaging the receptacle connector 2 because the pluggable module 3 is inserted upside down the receptacle connector 2, so the front end edge 312 herein also may refer to a corner region of the insertion end portion 30. And by the supporting effect of the strengthening rib 183 formed by the stopping piece 18 itself and the support stopping block 19, 19' behind the stopping piece 18, stability and structure strength of the stopping piece 18 may be increased, the stopping piece 18 is stronger to be subjected to the collision of the pluggable module 3.

The present embodiment mainly uses the stopping piece 18 formed in front of the receptacle connector 2, and the position and the structure of the stopping piece 18 may play the stopping function before the pluggable module 3 is inserted into the receptacle connector 2 when the pluggable module 3 is inserted upside down into the insertion space 11, 12.

In the previous first embodiment, the shielding cage 1 has the stopping piece 18 and the support stopping block 19, 19' at the same time, but in other varied manner, the shielding cage 1 also may be only provided with the stopping piece 18 or the support stopping block 19, 19', which similarly may attain the effect of stopping the pluggable module 3 and avoiding the pluggable module 3 colliding with the receptacle connector 2 when the pluggable module 3 is inserted upside down into the insertion space 11, 12, when the shielding cage 1 is only provided with the support stopping block 19, 19' and is not provided with the stopping piece 18, the support stopping block 19, 19' is used to stop the pluggable module 3. In addition, in the present embodiment, the stopping piece 18 is only formed to one of the two side walls of the insertion space 11, 12, that is, one of the two side plates 16 of the shielding cage 1, but in other manners, the two side walls of each insertion space 11, 12 each may be formed with the stopping piece 18 so that two stopping pieces to reduce over-insertions 18 are respectively provided in front of a left corner and a right corner of the front end surface 211 of the receptacle housing 21, and the two support stopping blocks 19, 19' are constructed by the bottom wall of each insertion space 11, 12 and are respectively used to support the two stopping pieces 18.

Referring to FIG. 11 to FIG. 14, a second embodiment of the present disclosure is illustrated; a connector assembly 400 includes a shielding cage 4, a receptacle connector 5 and a pluggable module (not shown), the shielding cage 4 is used to be provided on a carrying board 401, the receptacle connector 5 is provided in the shielding cage 4, the pluggable module may be inserted into the shielding cage 4 and inserted into and cooperated with the receptacle connector 5.

The shielding cage 4 includes an insertion space 41, a front end port 40 which is communicatively coupled to the insertion space 41 and a top wall 42, a bottom wall 43 and two side walls 44 to define the insertion space 41, and the shielding cage 4 further includes a withdrawing stop portion 45, a rear stopping piece 46 and a front stopping block 47. In the second embodiment, a specific structure of the shielding cage 4 includes an upper cage body 420 and a bottom plate which are engaged with each other, the upper cage body 420 includes a top plate and two side plates which are integrally connected with each other, the top plate constitutes the top wall 42, the two side plates constitutes the two side walls 44. Each side wall 44 is provided with the withdrawing stop portion 45 and the rear stopping piece 46, the withdrawing stop portion 45 is formed by that, a U-shaped cut hole 451 provided to the side wall 44 surrounds and defines a protruding tab which a tip thereof is toward the front and the protruding tab bends inwardly and obliquely, and the rear stopping piece 46 is formed by a protruding tab which protrudes rearwardly from a rear end edge of the side wall 44 and bends inwardly, the two front stopping blocks 47 are formed to the bottom wall 43, are spaced apart from each other in the left-right direction and extend into the insertion space 41, a specific structure of the front stopping block 47 is formed by that a partial region of the bottom wall 43 is stamped out and is bent upwardly. In addition, the rear end edge of each side wall 44 further is formed with a positioning hole 441 recessed therefrom, and a rear end edge of the top wall 42 is also formed with a positioning aperture 421 recessed therefrom, the rear stopping piece 46 and the positioning aperture 421 and positioning hole 441 also may be considered to be formed to a rear end edge of the shielding cage 4. The shielding cage 4 is assembled and fixed to the carrying board 401 by that a plurality of positioning legs 48, which each are L-shaped and formed to bottom edges of the two side walls 44 of the shielding cage 4, pass through holes of the carrying board 401 and then bend.

Figure 12:
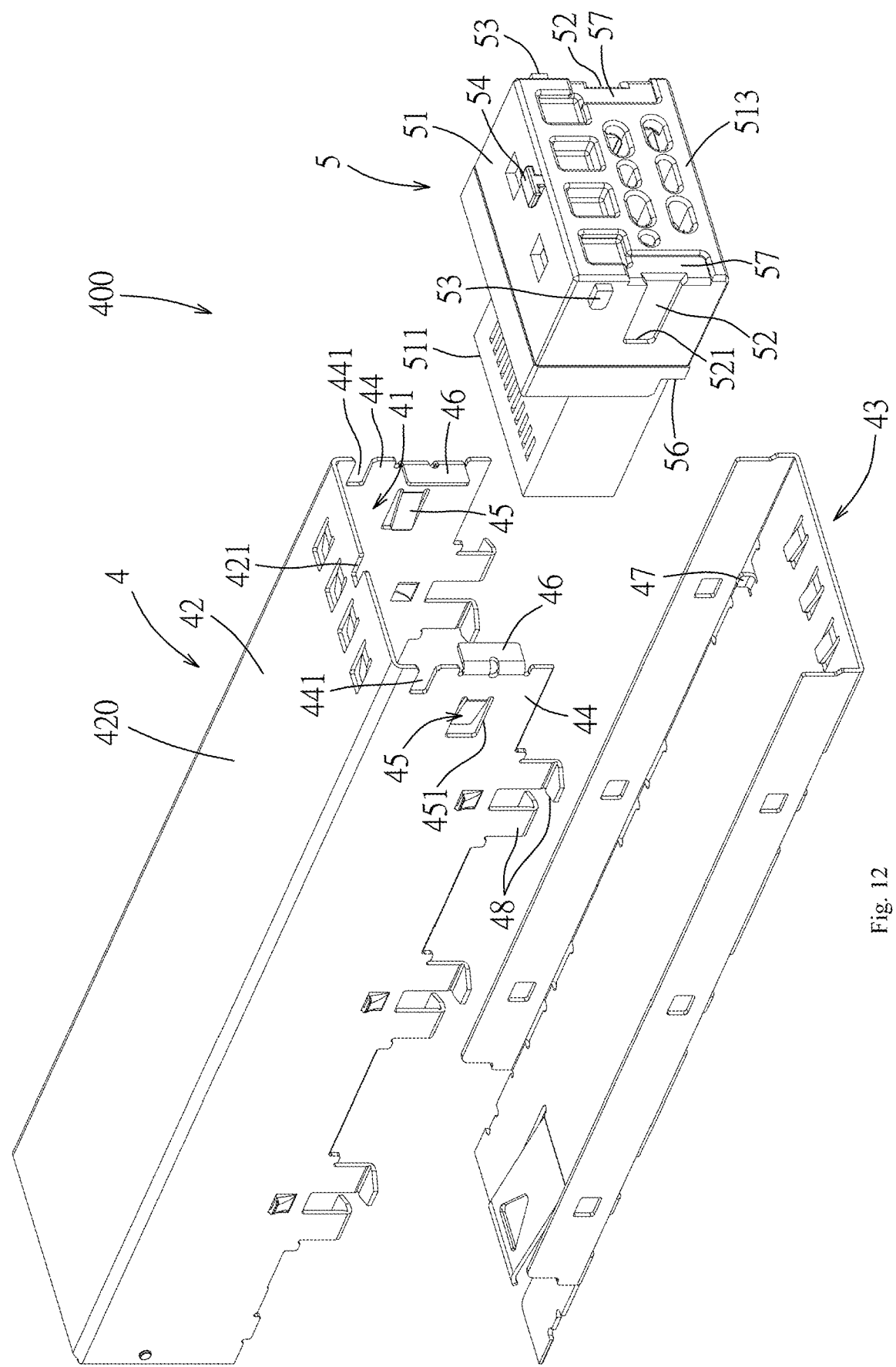
FIG. 12 is a perspective exploded view of the second embodiment.
Figure 13:
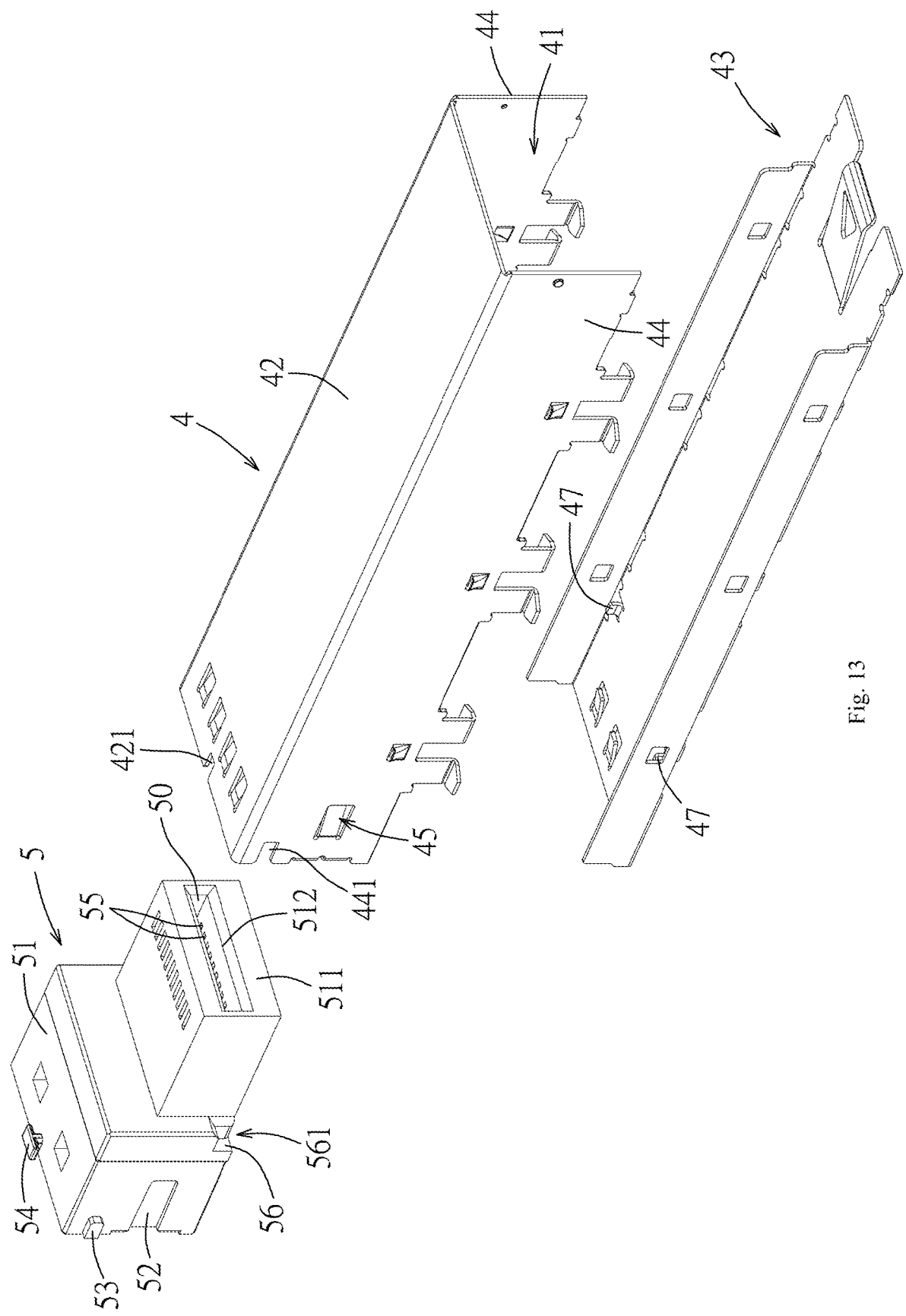
FIG. 13 is a perspective exploded view of the second embodiment from another angle.
Figure 14:
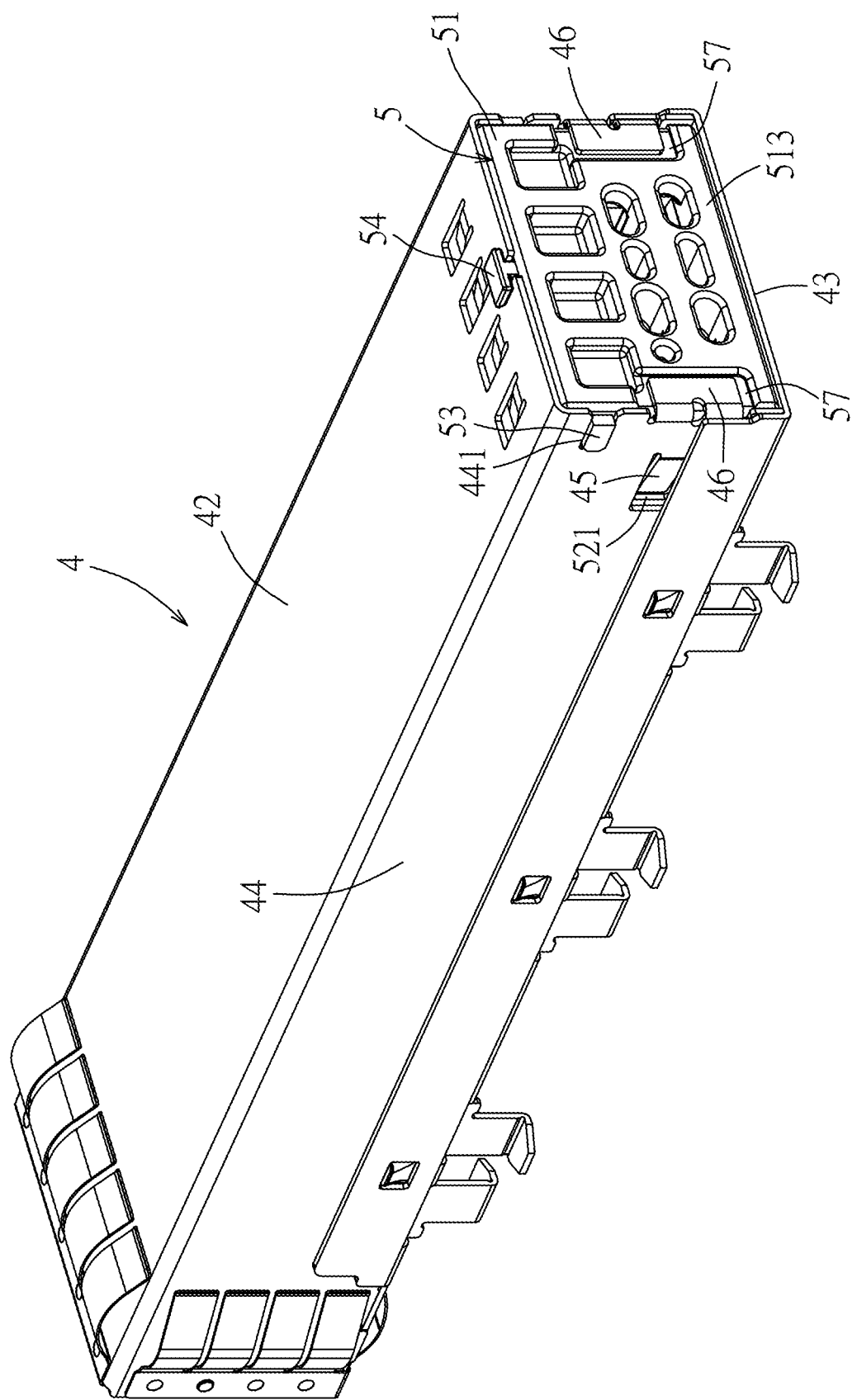
FIG. 14 is a perspective view of the second embodiment illustrating a state that the receptacle connector is assembled to the shielding cage.

The receptacle connector 5 is provide in a rear segment of the shielding cage 4, and the receptacle connector 5 includes a receptacle housing 51 and a terminal 55 provide in the receptacle housing 51, moreover, receptacle connector 5 further includes two recessed grooves 52 which are formed to a left side and a right side of the receptacle housing 51, two strip positioning blocks 53, a T-shaped positioning block 54 whose longitudinal section is T-shaped, and two forward stopping faces 56 which are positioned at a left side and a right side of a bottom portion of the receptacle housing 51 (only one of the two forward stopping faces 56 is visible in FIG. 12 and FIG. 13 due to view angle). The receptacle housing 51 has a front end surface 511 facing the front end port 40, an insertion slot 512 formed to the front end surface 511 to allow the pluggable module to insert therein, a rear end surface 513 and two recessed portions 57 formed in the rear end surface 513 and close to a left side and a right side of the rear end surface 513, the recessed groove 52 is recessed forwardly from the rear end surface 513, extends forwardly and has a stopping inner edge 521 facing rearwardly, the two strip positioning blocks 53 are respectively formed at the left side and the right side of the receptacle housing 51 and are respectively positioned above the two recessed grooves 52, the T-shaped positioning block 54 protrudes from and is formed to a top surface of the receptacle housing 51. In the present embodiment, the receptacle housing 51 is further formed with a recessed notch 561 which is recessed and is positioned at a corner of the receptacle housing 51 at each of a left side and a right side of a bottom portion of the front end surface 511, the forward stopping face 56 is an inner wall surface which is positioned in the recessed notch 561 and faces forwardly.

When the receptacle connector 5 is assembled into the shielding cage 4 from behind the shielding cage 4 toward the front, the two positioning blocks 53 respectively extend into the two positioning holes 441 and the T-shaped positioning block 54 extends into the positioning aperture 421 positioned in the top wall 42, thereby attaining the function of guiding and positioning, while the receptacle connector 5 is forwardly assembled to the shielding cage 4, by that the two withdrawing stop portions 45 at the two sides of the shielding cage 4 respectively extend into the two recessed grooves 52 at the two side of the receptacle housing 51, the tip of the protruding tab constituting the withdrawing stop portion 45 is stopped by the stopping inner edge 521 of the recessed groove 52, which may limit rearward displacement of the receptacle housing 51 and avoid the receptacle housing 51 withdrawing rearwardly from the shielding cage 4 due to a subjected pushing force. When the receptacle connector 5 is forwardly displaced so that the two front stopping blocks 47 are respectively positioned in the two recessed notches 561, which are positioned at two sides of a bottom portion of a front portion of the receptacle housing 51, and the two front stopping blocks 47 respectively abut against the two forward stopping faces 56 respectively, a position of the receptacle connector 5 which is assembled forwardly is limited, which is used as positioning of assembling, next, the two protruding tabs inwardly bend toward each other to respectively insert into the two recessed portions 57 in the rear end surface 513 of the receptacle housing 51 to respectively form the two rear stopping pieces 46, that is, forming another stopping mechanism stopping the receptacle connector 5 to rearward displace besides the withdrawing stop portion 45.

The present embodiment uses that the withdrawing stop portions 45 and the rear stopping pieces 46 of the shielding cage 4 and the receptacle connector 5 are provided to form structure interference therebetween, a function of preventing the receptacle connector 5 from withdrawing may be attained.

In conclusion, as set forth in the first embodiment, by the stopping piece 18, when the pluggable module 3 is inserted upside down into the shielding cage 1, the stopping piece 18 may provide a stopping function before the pluggable module 3 is inserted into the receptacle connector 2, which avoids the pluggable module 3 damaging the receptacle connector 2 because the pluggable module 3 is inserted upside down into the receptacle connector 2, and in addition to that the support stopping block 19, 19' support the stopping piece 18 so as to strengthen the structure stability and the strength of the stopping piece 18 subjected to collision, the support stopping block 19, 19' also may play the stopping function when the receptacle connector 2 is assembled to the shielding cage 1. Moreover, as set forth in the second embodiment, by the withdrawing stop portion 42 and the rear stopping piece 46, a strength of the receptacle connector 5 resisting to a rearward force may be strengthened, and the front stopping block 47 and the forward stopping face 56 similarly may play the stopping function when the receptacle connector 5 is assembled to the shielding cage 4.

However, what is described above is just the embodiments of the present disclosure, which is not intended to limit the scope implementing the present disclosure, any simple equivalent variations and modifications made according to the claims and the specification of the present disclosure will also be fallen within the scope of the present disclosure.

What is claimed is:

1. A connector assembly comprising:
   a shielding cage forming at least one insertion space and a front end port communicatively coupled to the insertion space, the insertion space being defined by a top wall, a bottom wall and two side walls;
   a receptacle connector provided to a rear segment of the shielding cage and comprising a receptacle housing; and
   the shielding cage further comprising at least one stopping piece and at least one support stopping block which extend into the insertion space, the support stopping block being interposed between the stopping piece and the receptacle housing and supporting the stopping piece.

2. The connector assembly according to claim 1, wherein the connector assembly further comprises a pluggable module which can insert into the insertion space; and
   when the pluggable module is inserted upside down into the insertion space, the pluggable module is stopped by the stopping piece and cannot be inserted into the receptacle connector.

3. The connector assembly according to claim 1, wherein the stopping piece has a rear end surface;
   the receptacle housing has a front end surface; and
   the support stopping block is interposed between the rear end surface of the stopping piece and the front end surface of the receptacle housing.

4. The connector assembly according to claim 3, wherein at least one of the two side walls of the shielding cage is integrally provided with the stopping piece;
   the at least one stopping piece bends from the side wall, extends into the insertion space and is positioned in front of the front end surface of the receptacle housing; and
   the support stopping block is integrally constructed from the bottom wall of the shielding cage.

5. The connector assembly according to claim 4, wherein the bottom wall is provided with two grooved holes which are spaced apart from each other, a part of the bottom wall between the two grooved holes bulges toward the insertion space to form the support stopping block.

6. The connector assembly according to claim 4, wherein the shielding cage comprises an upper cage body and a bottom plate which are engaged with each other and a partitioning frame which is provided between the upper cage body and the bottom plate; and
   the partitioning frame is provided in the shielding cage to partition the insertion space into two insertion spaces in an up-down direction, and the partitioning frame comprises an upper wall and a lower wall, the bottom wall of one of the two insertion spaces is defined by the upper wall of the partitioning frame, the bottom wall of the other of the two insertion spaces is defined by the bottom plate.

7. The connector assembly according to claim 4, wherein the stopping piece is positioned in front of one of the corners of the front end surface of the receptacle housing.

8. The connector assembly according to claim 7, wherein the side wall is provided with a cut hole which surrounds and defines a protruding tab, the protruding tab perpendicularly bends toward an inside of the insertion space relative to the side wall to form the stopping piece.

9. The connector assembly according to claim 8, wherein a bending location of the stopping piece where the protruding tab bends is provided with a strengthening rib.

10. A connector assembly comprising:
    a shielding cage forming at least one insertion space and a front end port communicatively coupled with the insertion space, the insertion space being defined by a top wall, a bottom wall and two side walls;
    a receptacle connector provided to a rear segment of the shielding cage and comprising a receptacle housing; and
    the shielding cage further comprising at least one stopping piece, the stopping piece integrally bending, extending into the insertion space and being positioned in front of a front end surface of the receptacle housing, wherein at least one of the two side walls of the shielding cage is provided with the stopping piece;
    the stopping piece is positioned in front of one of the corners of the front end surface of the receptacle housing;
    the side wall is provided with a cut hole which surrounds and defines a protruding tab, the protruding tab perpendicularly bends toward an inside of the insertion space relative to the side wall to form the stopping piece; and
    a bending location of the stopping piece where the protruding tab bends is provided with a strengthening rib.

11. The connector assembly according to claim 10, wherein
    the connector assembly further comprises a pluggable module which can insert into the insertion space; and
    when the pluggable module is inserted upside down into the insertion space, the pluggable module is stopped by the stopping piece and cannot be inserted into the receptacle connector.

12. The connector assembly according to claim 10, further comprising a support stopping block integrally formed to the bottom wall.

13. The connector assembly according to claim 10, wherein the bottom wall is provided with two grooved holes which are spaced apart from each other, and a part of the bottom wall between the two grooved holes bulges toward the insertion space to form the support stopping block.

14. The connector assembly according to claim 13, wherein
    the receptacle housing has a front end surface facing the front end port; and
    the support stopping block stops the front end surface of the receptacle housing.

* * * * *